(12) United States Patent
Botti et al.

(10) Patent No.: US 7,167,047 B2
(45) Date of Patent: Jan. 23, 2007

(54) MULTI-CHANNEL POWER AMPLIFIER SELF-CONFIGURING TO A BRIDGE OR SINGLE-ENDED OUTPUT, PARTICULARLY FOR AUDIO APPLICATIONS

(75) Inventors: Edoardo Botti, Vigevano (IT); Fabio Cagnetti, Corsico (IT)

(73) Assignee: STMicroelectronics S.r.l. (IT)

( * ) Notice: Subject to any disclaimer, the term of this patent is extended or adjusted under 35 U.S.C. 154(b) by 155 days.

(21) Appl. No.: 10/865,030

(22) Filed: Jun. 9, 2004

(65) Prior Publication Data
US 2005/0024139 A1 Feb. 3, 2005

(30) Foreign Application Priority Data
Jul. 9, 2003 (EP) ................... 03425357

(51) Int. Cl.
*H03F 3/217* (2006.01)
(52) U.S. Cl. .................. 330/251; 330/207 A
(58) Field of Classification Search .......... 330/251, 330/301, 207 A
See application file for complete search history.

(56) References Cited

U.S. PATENT DOCUMENTS

| | | | |
|---|---|---|---|
| 3,944,941 A * | 3/1976 | Tsuda ........................ 330/51 |
| 4,330,756 A | 5/1982 | Moreau |
| 4,494,077 A * | 1/1985 | Fukaya et al. ............. 330/295 |
| 4,894,621 A * | 1/1990 | Koenig et al. ............. 330/251 |
| 5,101,170 A * | 3/1992 | Torazzina et al. ........... 330/51 |
| 5,194,821 A | 3/1993 | Brambilla et al. |
| 5,365,188 A | 11/1994 | Botti et al. |
| 5,414,774 A * | 5/1995 | Yumoto ..................... 381/1 |
| 5,621,352 A | 4/1997 | Botti et al. |
| 5,648,742 A | 7/1997 | Ghaffaripour et al. |
| 5,654,688 A | 8/1997 | Allen et al. |

(Continued)

FOREIGN PATENT DOCUMENTS

EP          0 425 878          5/1991

(Continued)

OTHER PUBLICATIONS

European Search Report for EP 03 42 5358 dated Nov. 24, 2003.

(Continued)

*Primary Examiner*—Benny Lee
*Assistant Examiner*—Krista Flanagan
(74) *Attorney, Agent, or Firm*—Lisa K. Jorgenson; J. Mark Han; Graybeal Jackson Haley LLP

(57) ABSTRACT

In a multi-channel amplifier switching from a single-ended to a bridge configuration, one of the two operational amplifiers of the output bridge structure of each channel is kept at the design reference voltage (typically to half the supply voltage) for as long as the other operational amplifier of the output bridge structure does not begin to saturate and by connecting in common the gate nodes of the P-type MOS transistors and the gate nodes of the N-type MOS transistors of the output half bridge stages of all the operational amplifiers of the output bridge pairs of all the channels that are eventually configured to function as voltage reference buffer, when configuring the multi channel amplifier to function in a single-ended configuration.

14 Claims, 6 Drawing Sheets

U.S. PATENT DOCUMENTS

| | | | |
|---|---|---|---|
| 5,708,390 A | 1/1998 | Dunnebacke | |
| 5,973,368 A | 10/1999 | Pearce et al. | |
| 6,552,607 B1* | 4/2003 | Danielson | 330/10 |
| 6,563,377 B1* | 5/2003 | Butler | 330/10 |
| 2002/0097086 A1 | 7/2002 | Freek | |
| 2002/0125941 A1* | 9/2002 | Nguyen | 330/10 |
| 2003/0206058 A1* | 11/2003 | Paul et al. | 330/251 |
| 2004/0004517 A1* | 1/2004 | Ruha et al. | 330/251 |
| 2004/0227567 A1* | 11/2004 | Llewellyn | 330/9 |
| 2004/0232978 A1* | 11/2004 | Easson et al. | 330/10 |
| 2005/0068103 A1* | 3/2005 | Dupuis et al. | 330/251 |

FOREIGN PATENT DOCUMENTS

| | | |
|---|---|---|
| EP | 0 840 444 | 5/1998 |
| JP | 07 154160 | 6/1995 |

OTHER PUBLICATIONS

European Search Report for EP 03 42 5357 dated Nov. 25, 2003.

* cited by examiner

MULTI-CHANNEL POWER AMPLIFIER SELF-CONFIGURING TO A BRIDGE OR SINGLE-ENDED OUTPUT, PARTICULARLY FOR AUDIO APPLICATIONS

PRIORITY CLAIM

This application claims priority from European patent application No. 03425357.5, filed Jun. 9, 2003, which is incorporated herein by reference.

CROSS REFERENCE TO RELATED APPLICATIONS

This application is related to U.S. patent application Ser. No. 10/865,039 entitled MULTI-CHANNEL POWER AMPLIFIER WITH CHANNELS INDEPENDENTLY SELF-CONFIGURING BRIDGE OR SINGLE-ENDED OUTPUT, PARTICULARLY FOR AUDIO APPLICATIONS, which has a common filing date and owner, and which is incorporated by reference.

TECHNICAL FIELD

The present invention relates in general to amplifiers and in particular to amplifiers with a reduced power consumption specially for car radio and HI-FI audio applications.

BACKGROUND

In many applications and primarily in audio reproduction systems, for example in car radios, HI-FI audio systems and similar apparatuses that are intrinsically compact because of stringent installation requirements, as well as in portable apparatuses, power dissipation in final power stages, often quadrupled in order to drive a pair of loudspeakers (front and rear) for each stereo channel, may create heat balance problems. For example, four 20 W amplifiers may have a power dissipation of about 4×12=48 W and because of the limited space available in certain apparatuses, such a relatively large power may be difficult to dissipate without a significant increase of temperature within the apparatus.

On the other hand, a relatively high temperature of operation may degrade the magnetic tape of cassettes or optical disks (CD), the drives of which are often tightly fitted inside a single apparatus case.

The so-called D-type switching amplifiers are highly efficient and are considered the most appropriate type for these applications.

Unfortunately, switching amplifiers generate electromagnetic emissions that in compact apparatuses may interfere with the correct functioning of other systems, reducing their performances. For these reasons, audio signals are frequently amplified using a pair of class AB power amplifiers, operating in single-ended mode or in bridge configuration depending on the level of the processed signal.

In fact, class AB power amplifiers are less efficient than switching amplifiers and a common technique for reducing power consumption of class AB amplifiers consists in configuring them in single-ended instead of in bridge configuration whenever it is possible to do so. In fact, these amplifiers dissipate more power in bridge configuration than in single-ended configuration as long as the level of the output signal remains smaller than the positive supply voltage. Unfortunately, it is not possible to use single-ended class AB amplifiers if the output surpasses this voltage because the output signal would be severely distorted by clipping.

Techniques for automatically switching from one configuration to the other in function of the monitored level of the signal are implemented in the commonly owned patents U.S. Pat. No. 5,194,821, U.S. Pat. No. 5,365,188 and U.S. Pat. No. 5,654,688.

The patent U.S. Pat. No. 5,194,821 discloses a bridge amplifier using positive and negative supply voltages, that may function in single-ended or in differential or bridge output configuration, depending on the level of the output signal. Substantially, a comparator changes the output circuital configuration of the amplifier from a bridge configuration to a single-ended configuration or vice versa by closing or opening configuring switches, when the output signal becomes smaller than or greater than a certain threshold voltage.

The patents U.S. Pat. No. 5,365,188 and U.S. Pat. No. 5,654,688 disclose a single supply dual bridge power amplifier, having a window comparator for sensing the level of input signals fed to the amplifier and driving the switches that coordinately configure the amplifier in either a bridge or in a single-ended configuration.

The switching from a single-ended to a bridge output configuration and vice versa may cause distortions and EMI disturbances in view of the fact that, when functioning with relatively low signal level, one of the operational amplifiers of the bridge output structure is configured to work as a buffer outputting a constant reference voltage that usually is equal to half the supply voltage and whenever it must switch to function as a second operational amplifier for driving the load in a bridge mode following an increase of the signal level, this operational amplifier must rapidly assume a different output voltage, that is its output voltage undergoes a step variation.

A known approach to reduce this step variation of the output voltage of the operational amplifier that is configured to function as a buffer when switching to a single-ended configuration is disclosed in U.S. Pat. No. 5,654,688, and is based on the use of a common mode control loop employing a sample-and-hold circuit. It has been found that though this solution is satisfactory when the signals of the different channels of the amplifier are substantially correlated among each other, the effectiveness in reducing the output step variations upon changing the configuration and the above-mentioned consequences diminishes significantly if the signals of the different channels functioning in a bridge mode are no longer correlated.

This phenomenon has become evident in investigating the reasons why in modern car audio systems the distortion would inexplicably increase under certain circumstances.

It has been found that increased EMI and increased distortions occur when the correlation between the signals that are fed to the four channels of the audio system diminishes due to different settings of independent channel equalization controls that are customarily provided in quality car audio systems.

The independent equalization setting on the various channels cause different delays of propagation of signals through the channels, that thus become substantially uncorrelated.

SUMMARY

An embodiment of the present invention overcomes the above-discussed problems of known multi-channel amplifiers switching from a single-ended to a bridge configuration when the different signals of the various channels are relatively uncorrelated with each other.

This embodiment provides an effective solution to the above-mentioned limitations and problems. One of the two operational amplifiers of the output bridge structure of each channel is kept at the design reference voltage (typically to half the supply voltage) for as long as the other operational amplifier of the output bridge structure does not begin to saturate and by connecting in common the gate nodes of the P-type MOS transistors and the gate nodes of the N-type MOS transistors of the output half bridge stages of all the operational amplifiers of the output bridge pairs of all the channels that are eventually configured to function as voltage reference buffer, when configuring the multi channel amplifier to function in a single-ended configuration.

By so connecting in common the gate nodes of the output transistor pairs of all the buffer configurable operational amplifiers of the output bridge structures of each channel, they are effectively prevented from delivering differential mode currents to the loads, but instead deliver common mode currents (that is currents of equal sign), making them behave practically as a single buffer.

The switches that connect in common the gate nodes of the power transistors of the same type are controlled in phase with the switches that configure the multi channel amplifier to function in a single-ended configuration, referred to a constant reference voltage.

BRIEF DESCRIPTION OF THE DRAWINGS

Different aspects and advantages of this invention will appear even more clearly through the following non-limiting description of various embodiments, making reference to the attached drawings, wherein.

DETAILED DESCRIPTION

Figure 1:
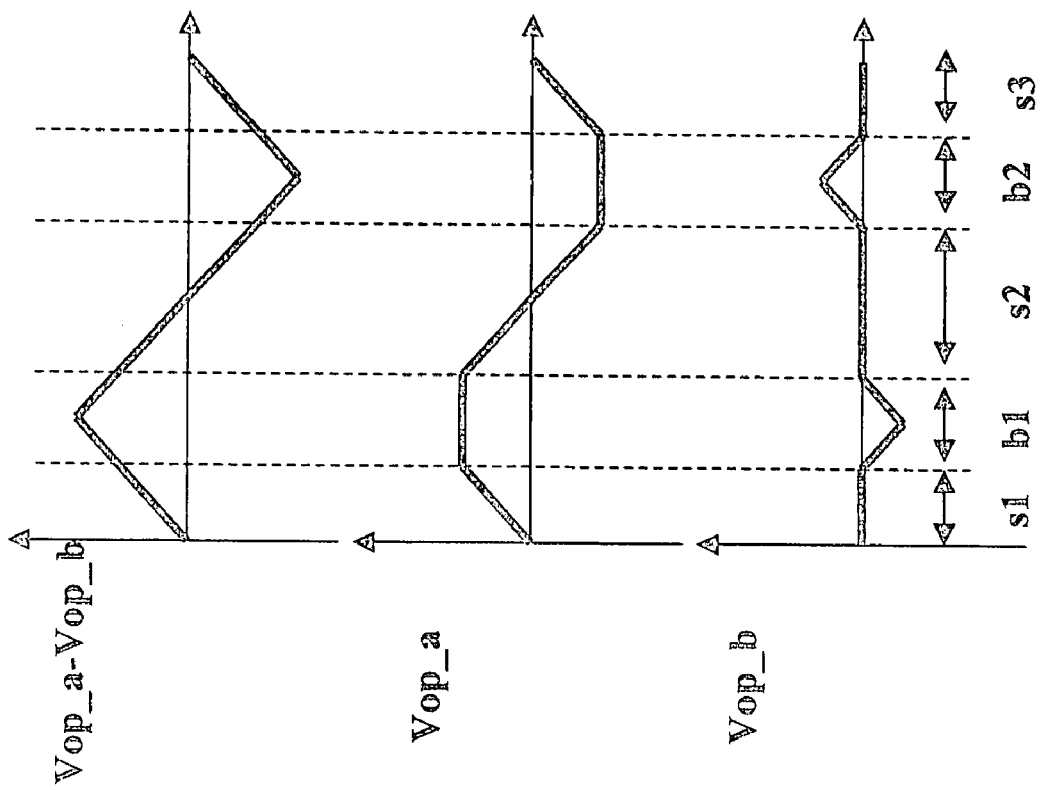
FIG. 1 shows the typical output waveforms of the pair of operational amplifiers (VOp-a and VOp-b) that form the output bridge structure of one channel for driving a respective load of the multi-channel amplifier according to an embodiment of the invention.
Figure 1:
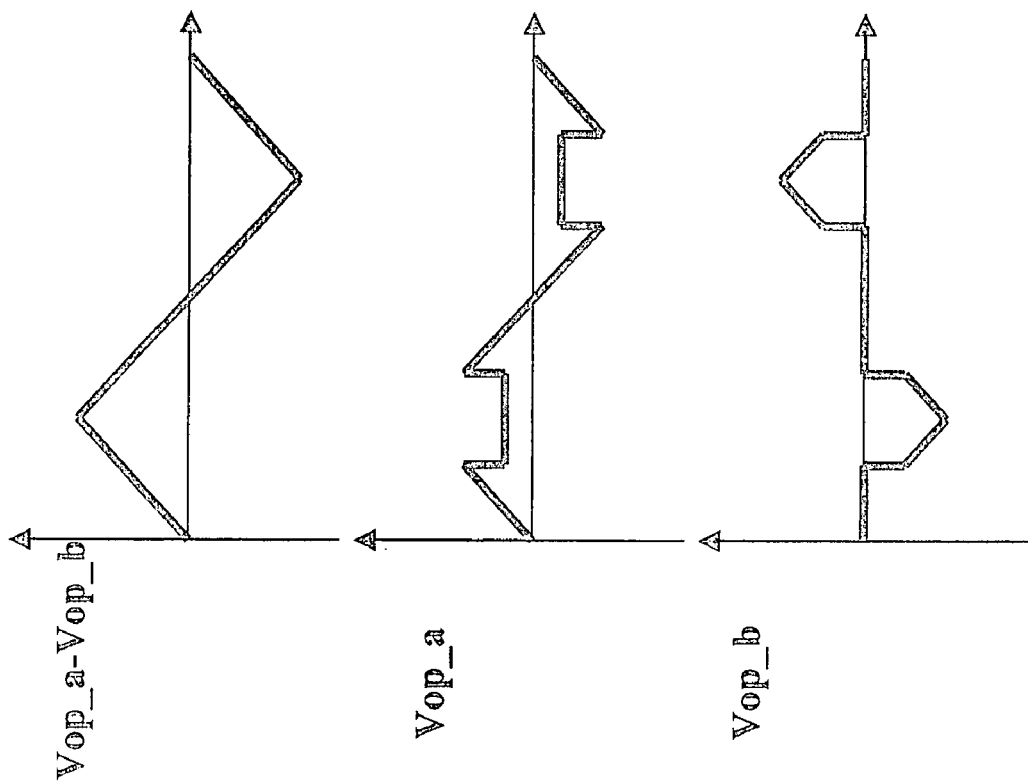
Figure 2:
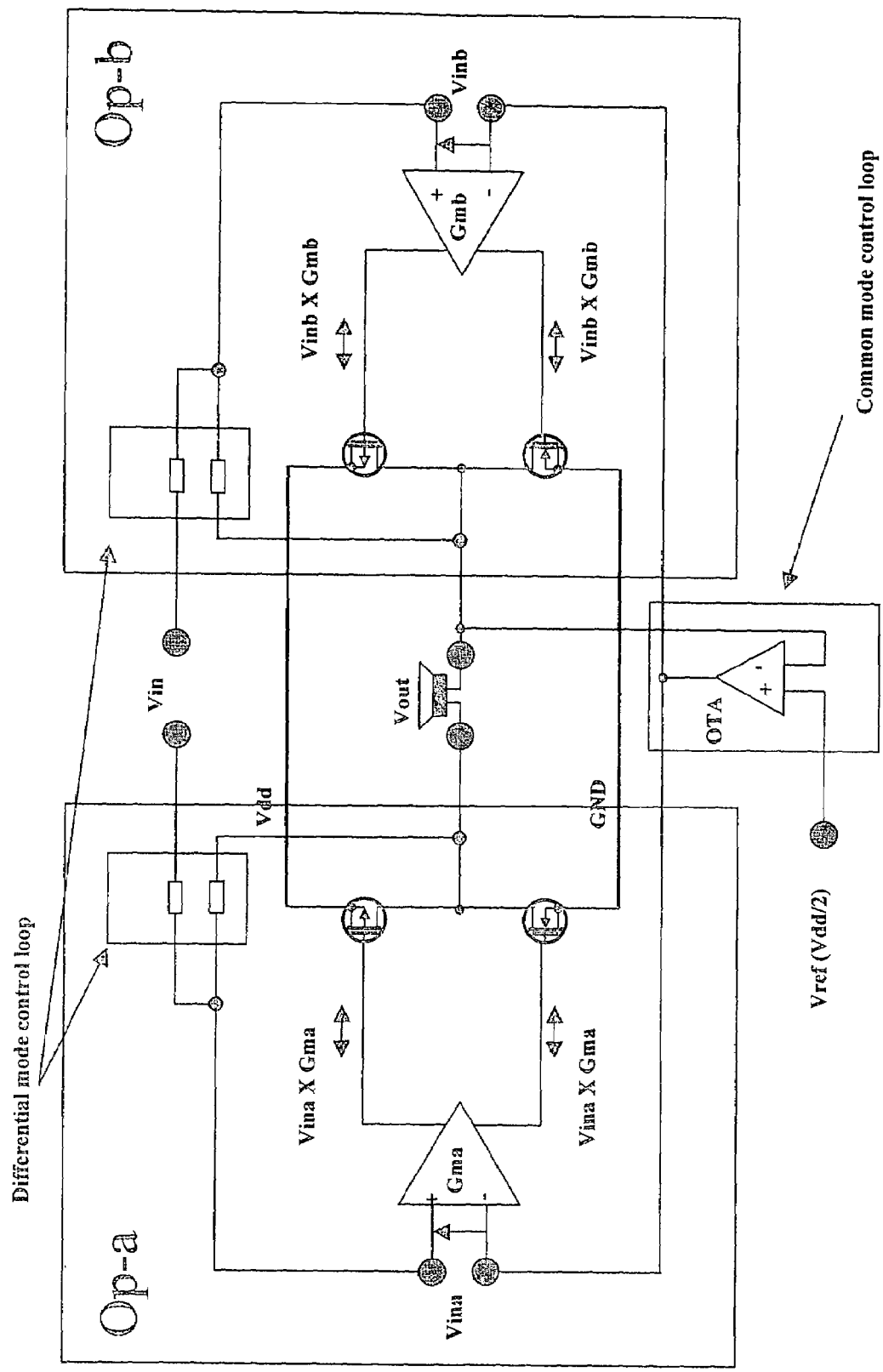
FIG. 2 shows an output bridge structure of a channel of a multi-channel amplifier provided with an asymmetric common mode control loop according to an embodiment of this invention.

With reference to FIG. 2 that shows the output bridge structure of one channel of a multi-channel amplifier according to an embodiment of the invention. A common mode control loop is visible in the lower dark background box. The common mode loop that typically includes a differential amplifier OTA, contrary to the common practice of fully differential amplifiers, instead of being symmetric by having the inverting input of the differential amplifier connected to a voltage equivalent to half the sum of the output voltages, according to this embodiment the inverting input (−) of the differential amplifier OTA is connected to the output node of the operational amplifier Op-b of the pair (Op-a, Op-b) forming the output power bridge structure of the channel that is eventually configured to function as the voltage reference buffer when switching to single-ended configuration.

This ensures that the output node of the operational amplifier Op-b be kept at a voltage very close to the reference voltage $V_{REF}$ that is applied to the non inverting node (+) of the differential amplifier OTA of the common mode control loop, until the other operational amplifier Op-a enters saturation.

When this occurs, by virtue of the combination between the common mode feedback and of the differential mode feedback, the common mode control loop unbalances, thus ceasing to control the output of the operational amplifier Op-b, which thereafter will follow only the differential mode feedback.

By minimizing the ability of the asymmetric common mode control loop to keep the output of the operational amplifier Op-b at the constant voltage reference $V_{REF}$, any harmonic distortion that could be induced is also effectively minimized.

Figure 3:
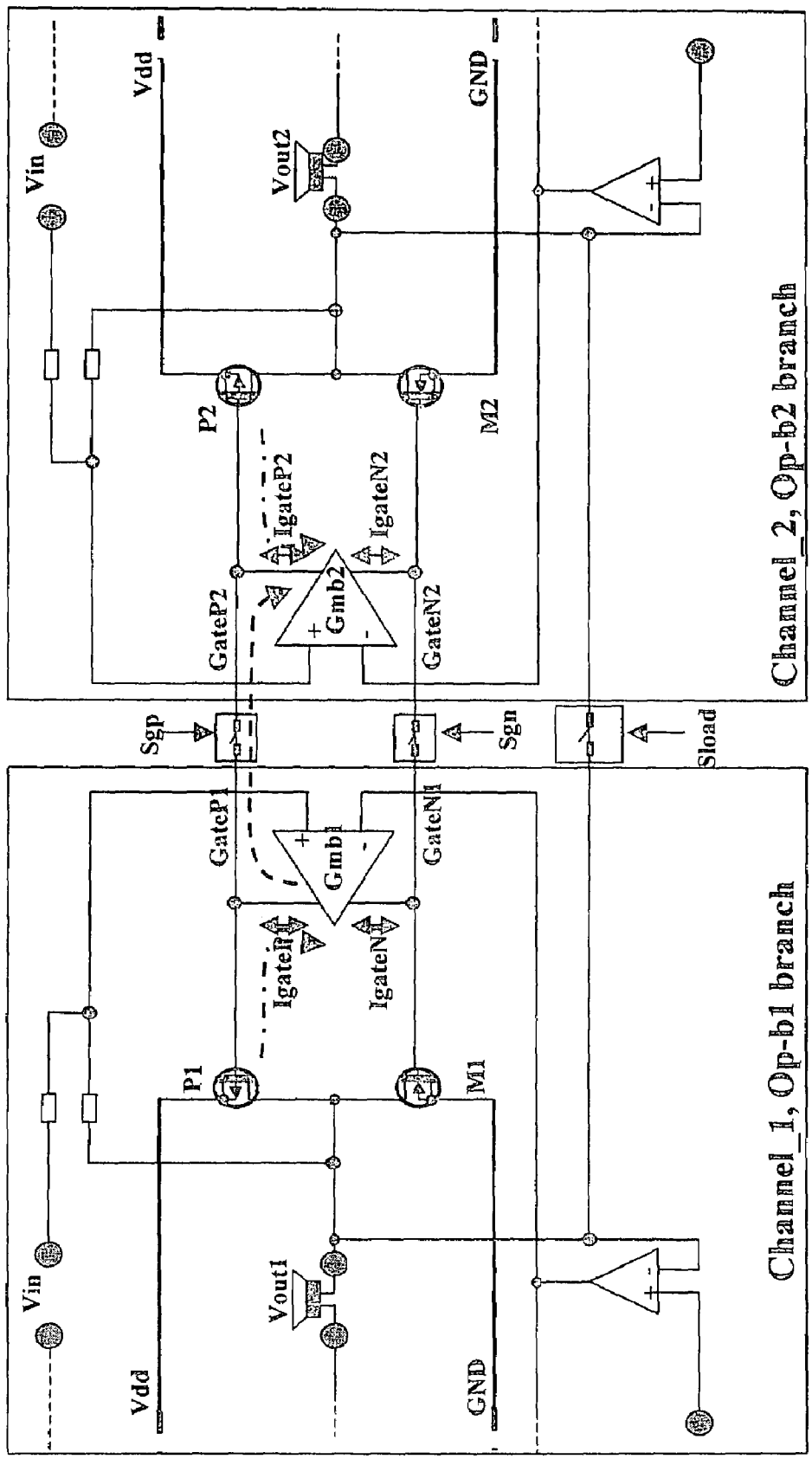
FIG. 3 is a circuit diagram showing a way of connecting in common the gate nodes of the output transistors of the same type of the operational amplifier that is eventually configured to function as voltage reference buffer of the output bridge structure of two channels of the amplifier, when connecting in common the loads for single-ended operation of the multi-channel amplifier according to an embodiment of the invention.

Another aspect of optimization of the performance of the multi-channel amplifier when functioning in a single-ended configuration to a constant reference voltage $V_{REF}$, is illustrated in FIG. 3 according to an embodiment of the invention.

As shown in FIG. 3, when switching to a single-ended configuration, the power switch Sload is closed in order to connect in common the output nodes of the operational amplifiers Op-b1 and Op-b2, respectively belonging to the power bridge structure of two channels, Channel_1 and Channel_2 of the multi-channel amplifier.

According to this embodiment, together (in-phase) with the power switch Sload, the switches Sgp and Sgn are also closed for connecting in common the gate nodes of the power MOS transistors of the same type of the two operational amplifiers Op-b1 and Op-b2. In this way, if a power transistor of the operational amplifier of one channel would be turned on while the corresponding power transistor of the operational amplifier of the other channel is off (for example the power transistors P1 and P2 of Op-b1 and of Op-b2), the gate currents output by the respective driving trans-conductance stages Gmb1 and Gmb2 tend to equalize the driving of the two transistors and (dash line), therefore both power transistors will tend to remain in an off state.

On the contrary, if the two corresponding power transistors (P1 and P2) of the operational amplifier of the pairs of two channels are turned on or turned off simultaneously (dash dot lines), the current through the relative switch Sgn or Sgp tends to be virtually zero, and thus the two power transistors are eventually able of delivering current to the respective load.

The differential feedback causes the two operational amplifiers Op-b1 and Op-b2 so connected of the two channels to behave as a single voltage reference buffer with output to $V_{REF}$.

By opening all the three switches Sload and Sgn and Sgp, the output bridge structures of the two channels, totally independent from each other, are able to drive their respective loads with the fullest output voltage swing.

Of course, as in any other multi-channel power amplifier, self configuring in a bridge or in a single-ended configuration, the configuring switches are controlled by logic signals generated by comparators monitoring the amplitude of the processed signals.

In particular the switches Sload, Sgn and Sgp are closed when the peak value of the output signal remains below the reference voltage (commonly half the supply voltage); when the peak value of the output signal surpasses such a threshold, these switches are opened.

Figure 4:
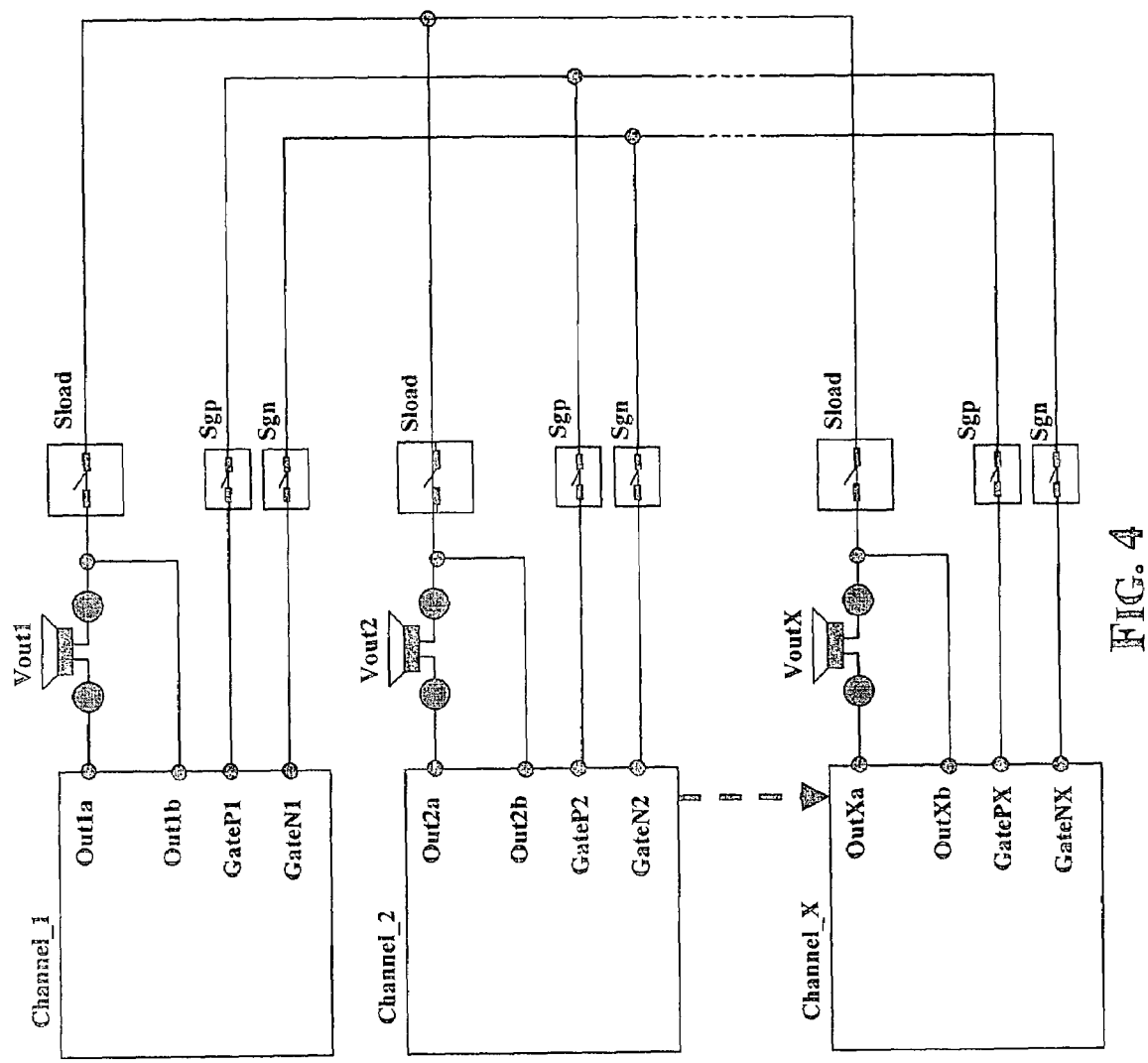
FIG. 4 is a block diagram of an amplifier having X number of channels for driving an X number of loads, showing the configuring switches and the switches to connect in common the gate nodes of the output transistors of the same type, according to an embodiment of this invention.

FIG. 4 is a simplified block diagram of a multi channel amplifier having an X number of channels showing the configuring switches according to an embodiment of the present invention.

Figure 5:
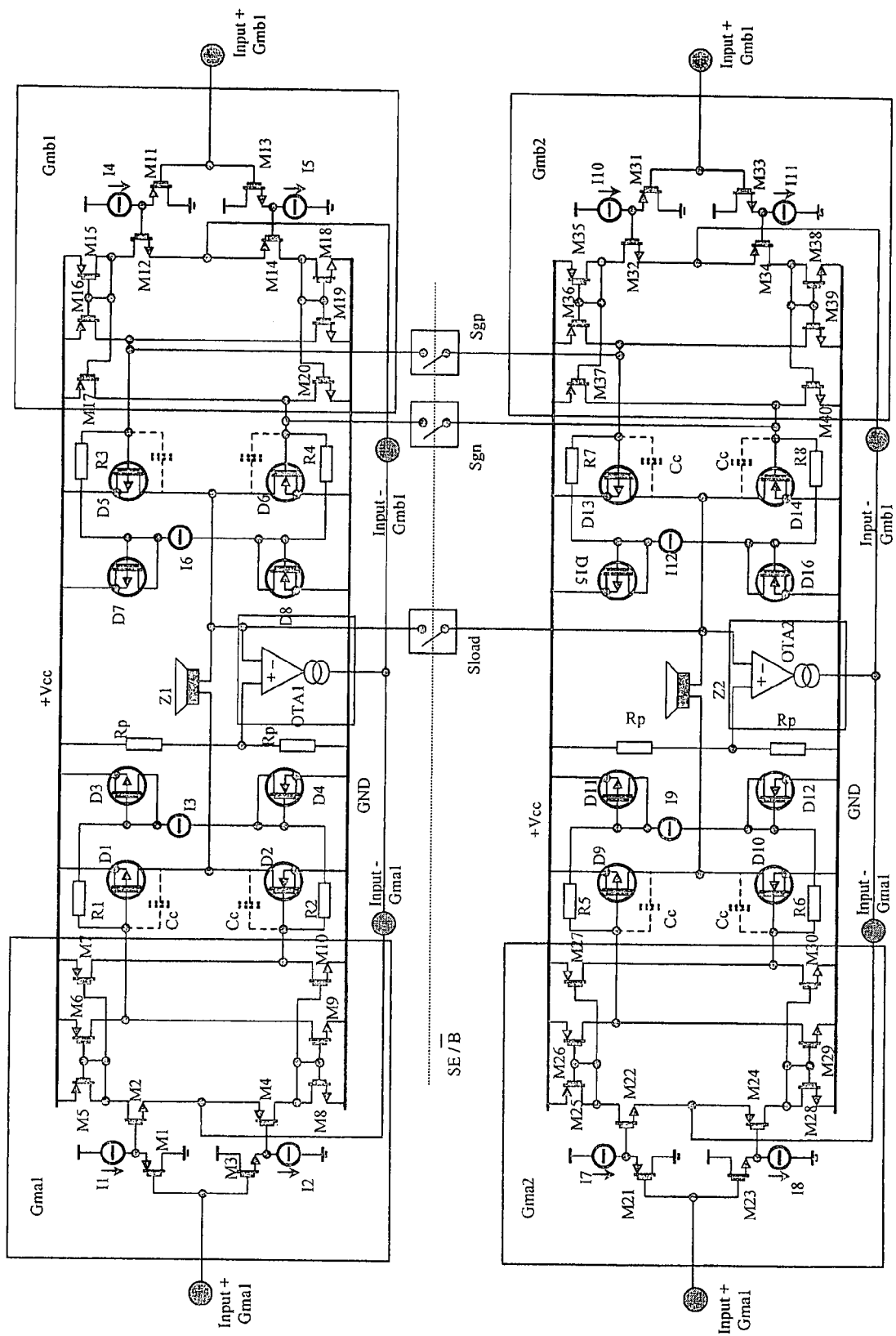
FIG. 5 shows a two-channel embodiment of an amplifier according to this invention.

FIG. 5 shows, according to an embodiment of the invention, a detailed circuit diagram of a two-channel power amplifier provided with the asymmetric common mode control loop OTA1, OTA2 and with the additional switches Sgn and Sgp for connecting in common the gate nodes of the P-type MOS transistors and the gate nodes of the N-type MOS transistors respectively of the output power stages of the operational amplifiers of the two channels having their output nodes connectable in common through the single-ended configuring power switch Sload.

Figure 6:
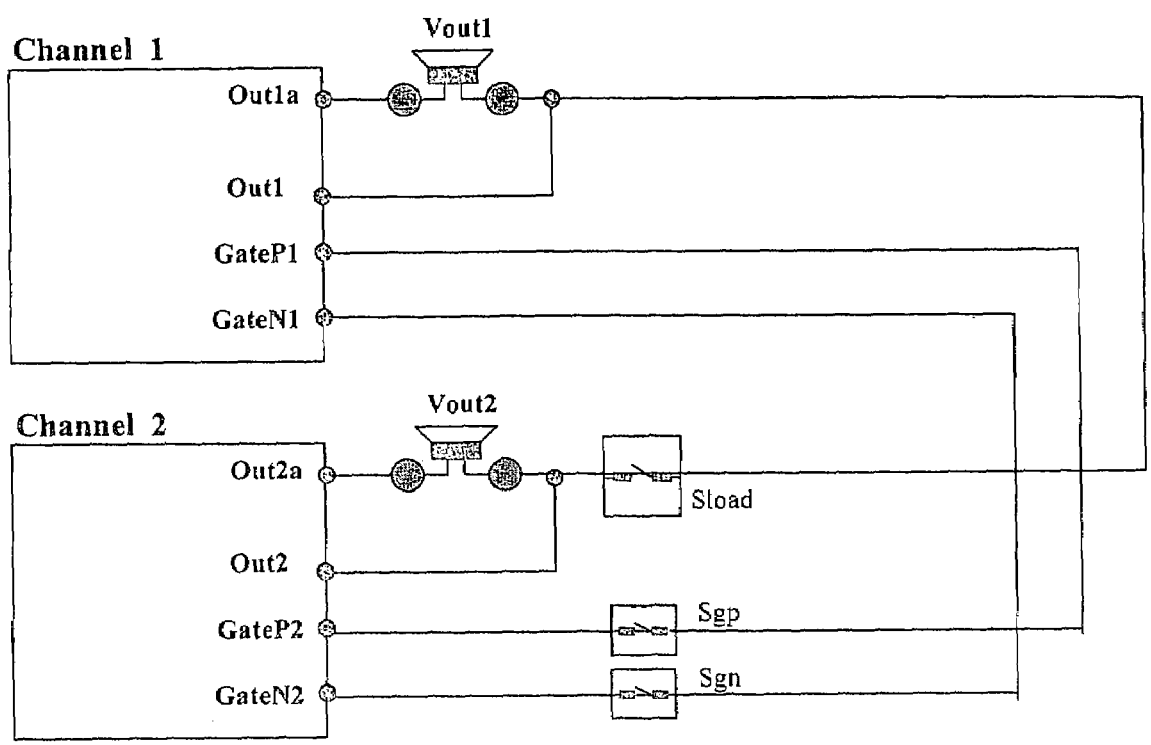
FIG. 6 is a block diagram of the two-channel amplifier of FIG. 5, showing the switches according to an embodiment of this invention.

FIG. 6 is a simplified block diagram of the two-channel amplifier of FIG. 5, showing the configuring switches Sgn, Sgp and Sload according to an embodiment of the invention.

One or more of the circuits of FIGS. 2–6 can be disposed on one or more integrated circuits, which may be incorporated into an electronic system such as a car radio.

From the foregoing it will be appreciated that, although specific embodiments of the invention have been described herein for purposes of illustration, various modifications may be made without deviating from the spirit and scope of the invention.

What is claimed is:

1. A multi-channel power amplifier for driving a plurality of loads, each associated with a respective channel, each channel comprising a pair of operational amplifiers, first and second, each composed of a differential trans-conductance stage controlling the gates of a p-type MOS transistor and of an n-type MOS transistor forming an output push-pull stage of the operational amplifier, one of said operational amplifiers of each channel functioning either in a bridge configuration with the other operational amplifier to drive the respective load or, by closing first configuring switches connecting together said loads, in single-ended configuration to a constant reference voltage for driving said loads connected in common, the amplifier further comprising at least a window comparator for monitoring the level of an input signal and outputting a logic control signal for said switches, wherein the amplifier comprises:
an asymmetric common mode control loop of each output bridge, including a differential amplifier having a non inverting input coupled to a constant reference voltage and an inverting input connected to the output node of said one of the two operational amplifiers of each channel for keeping their output node at a voltage substantially equal to said reference voltage until the other operational amplifier of the channel saturates; and
switch means for respectively connecting in common the gate nodes of the p-type MOS and the gate nodes of the n-type MOS transistors of the output push-pull stages of all said one operational amplifier of all the channels when functioning in single-ended configuration.

2. The multi-channel power amplifier of claim 1, wherein said operational amplifiers are all class AB amplifiers.

3. A power amplifier for driving multiple loads each having two respective terminals, the amplifier comprising:
multiple channels each comprising,
two complementary drive stages operable to drive a respective one of the loads in a differential manner and in a single-ended manner during differential and single-ended operating modes, respectively, and
a respective reference circuit operable to maintain a reference terminal of the load at a reference voltage during the single-ended operating mode,
wherein the reference circuit of each channel comprises a differential amplifier having a first input node operable to receive the reference voltage, a second input node coupled to the reference terminal of the load, and an output node coupled to the first and second drive stages.

4. The power amplifier of claim 1 wherein:
one of the drive stages of each channel comprises first and second drive nodes that are coupled to the reference terminal of the respective load via first and second drive circuits, respectively; and
each of the channels further comprises a switch circuit that during the single-ended operating mode is operable to couple the reference terminal of the load to the reference terminals of all other loads that respective channels are driving in a single-ended manner and to couple the first and second drive nodes to the first and second drive nodes, respectively, of these respective channels.

5. A power amplifier for driving a load having first and second terminals, the amplifier comprising:
a first driving stage having a first input node operable to receive an input signal, a second input node, and a first output node operable to be coupled to the first terminal of the load;
a second driving stage having a first input node operable to receive the input signal, a second input node, and a first output node operable to be coupled to the second terminal of the load; and
a reference stage having a first input node operable to receive a reference voltage, a second input node operable to be coupled to one of the terminals of the load, and an output node coupled to the second input nodes of the first and second driving stages, and operable to maintain the terminal of the load at the reference voltage during single-ended operation of the first and second driving stages.

6. The power amplifier of claim 5 wherein:
the first input nodes of the first and second driving stages comprise respective noninverting input nodes; and
the second input nodes of the first and second driving stages comprise respective inverting input nodes.

7. The power amplifier of claim 5 wherein:
the first and second driving stages respectively comprise first and second operational amplifiers; and
the reference stage comprises a third operational amplifier.

8. The power amplifier of claim 5 wherein the first input nodes of the first and second driving stages are respectively operable to receive first and second differential components of the input signal.

9. An electronic system, comprising:
a power amplifier operable to drive multiple loads each having two respective terminals, the amplifier comprising multiple channels that each comprise,
two complementary drive stages operable to drive a respective one of the loads in a differential manner and in a single-ended manner during differential and single-ended operating modes, respectively, and a respective reference circuit operable to maintain a reference terminal of the load at a reference voltage during the single-ended operating mode;

wherein the power amplifier is operable to receive a supply voltage; and wherein the reference voltage equals half of the supply voltage.

10. An electronic system, comprising:

a power amplifier for driving a load having first and second terminals, the amplifier comprising, a first driving stage having a first input node operable to receive an input signal, a second input node, and a first output node operable to be coupled to the first terminal of the load, a second driving stage having a first input node operable to receive the input signal, a second input node, and a first output node operable to be coupled to the second terminal of the load, and a reference stage having a first input node operable to receive a reference voltage, a second input node operable to be coupled to one of the terminals of the load, and an output node coupled to the second input nodes of the first and second driving stages, and operable to maintain the terminal of the load at the reference voltage during single-ended operation of the first and second driving stages.

11. A method, comprising:

simultaneously driving at least one of three loads independently and differentially and at least another of the three loads single-endedly in response to a predetermined criteria;

generating a respective reference voltage at a reference terminal of each load while driving the load single endedly; and coupling together the reference terminals of all the loads being driven single endedly.

12. The method of claim 11 wherein the predetermined criteria comprises amplitudes of respective signals driving the loads.

13. A method, comprising:

receiving differential components of an input signal at respective first input nodes of first and second drive stages;

driving first and second terminals of a load with the respective first and second drive stages during differential operation; and during single-ended operation, driving the first terminal of the load with the first drive stage and generating a control signal on respective second input nodes of the first and second drive stages such that the second drive stage generates a predetermined reference voltage on the second terminal of the load.

14. The method of claim 13, further comprising:

operating the first and second drive stages differentially if an amplitude of the input signal is greater than a predetermined threshold; and operating the first and second drive stages single endedly if the amplitude of the input signal is less than the predetermined threshold.

* * * * *